(12) United States Patent
Felix et al.

(10) Patent No.: US 9,245,595 B2
(45) Date of Patent: Jan. 26, 2016

(54) SYSTEM AND METHOD FOR PERFORMING SRAM ACCESS ASSISTS USING VSS BOOST

(71) Applicant: NVIDIA Corporation, Santa Clara, CA (US)

(72) Inventors: Stephen Felix, Bristol (GB); Stéphane Badel, Lausanne (CH)

(73) Assignee: NVIDIA Corporation, Santa Clara, CA (US)

( * ) Notice: Subject to any disclaimer, the term of this patent is extended or adjusted under 35 U.S.C. 154(b) by 36 days.

(21) Appl. No.: 14/137,859

(22) Filed: Dec. 20, 2013

(65) Prior Publication Data

US 2015/0179232 A1 Jun. 25, 2015

(51) Int. Cl.
*G11C 11/419* (2006.01)
*G11C 5/14* (2006.01)
*G11C 11/412* (2006.01)
*G11C 11/417* (2006.01)
*G11C 8/16* (2006.01)

(52) U.S. Cl.
CPC .............. *G11C 5/145* (2013.01); *G11C 11/419* (2013.01); *G11C 5/14* (2013.01); *G11C 8/16* (2013.01); *G11C 11/412* (2013.01); *G11C 11/417* (2013.01)

(58) Field of Classification Search
CPC .... G11C 5/147; G11C 11/419; G11C 11/417; G11C 11/412; G11C 8/16; G11C 5/14

USPC ........................ 365/154, 226, 189.09, 189.11
See application file for complete search history.

(56) References Cited

U.S. PATENT DOCUMENTS

| | | | |
|---|---|---|---|
| 7,466,581 B2 * | 12/2008 | Huang et al. ................... | 365/154 |
| 2007/0002617 A1 * | 1/2007 | Houston et al. ........... | 365/185.07 |
| 2010/0188909 A1 * | 7/2010 | Kenkare et al. ........... | 365/189.16 |
| 2011/0026309 A1 * | 2/2011 | Kumar et al. ................. | 365/154 |

FOREIGN PATENT DOCUMENTS

GB 2456640 A 7/2009

OTHER PUBLICATIONS

Slide 16 of Lebeck, Memory Systems, 1998.*
Mukhopadyay et al., SRAM Write-Ability Improvement With Transient Negative Bit-Line Voltage, IEEE transactions on very large scale integration (VLSI) System. vol. 19 No. 1 Jan. 2011.*

(Continued)

*Primary Examiner* — Ly D Pham
(74) *Attorney, Agent, or Firm* — Zilka-Kotab, PC

(57) ABSTRACT

A method and a system are provided for performing memory access assist using voltage boost. A memory access request is received at a storage cell array that comprises two or more subarrays, each subarray including at least one row of storage cells. The voltage boost is applied, during the memory access, to a first negative supply voltage of a first storage cell subarray of the two or more storage cell subarrays. The first negative supply voltage of the first storage cell subarray is lower than a second negative supply voltage of a second storage cell subarray of the two or more storage cell subarrays.

20 Claims, 11 Drawing Sheets

(56) References Cited

OTHER PUBLICATIONS

Karl, E. et al., "4.6GHz 162Mb SRAM Design in 22nm Tri-Gate CMOS Technology with Integrated Active Vmin-enhancing Assist Circuitry," 2012 IEEE International Solid-State Circuits Conference, Session 13, 2012, pp. 230-232.

Yabuuchi, M. et al., "A 45nm 0.6V Cross-Point 8T SRAM with Negative Biased Read/Write Assist," 2009 Symposium on VLSI Circuits Digest of Technical Papers, 2009, pp. 158-159.

* cited by examiner

US 9,245,595 B2

SYSTEM AND METHOD FOR PERFORMING SRAM ACCESS ASSISTS USING VSS BOOST

FIELD OF THE INVENTION

The present invention relates to storage circuits, and, more specifically to access assist.

BACKGROUND

Static random access memory (SRAM) arrays are sometimes designed to include voltage assist circuitry to improve performance and/or reliability, enabling operation of the SRAM at a lower supply voltage. Specifically, voltage assist can improve the ability to read from and write to SRAM cells, and can prevent stored values from being inadvertently flipped during read and write operations. Existing assist mechanisms are typically applied to all of the storage cells in a memory array. This can result in the assist circuitry being relatively large and consuming a significant amount of power. Thus, there is a need for addressing the issue of access reliability and/or other issues associated with the prior art.

SUMMARY

A method and a system are provided for performing memory access assist using voltage boost. A memory access request is received at a storage cell array that comprises two or more subarrays, each subarray including at least one row of storage cells. The voltage boost is applied, during the memory access, to a first negative supply voltage of a first storage cell subarray of the two or more storage cell subarrays. The first negative supply voltage of the first storage cell subarray is lower than a second negative supply voltage of a second storage cell subarray of the two or more storage cell subarrays.

DETAILED DESCRIPTION

Figure 1A:
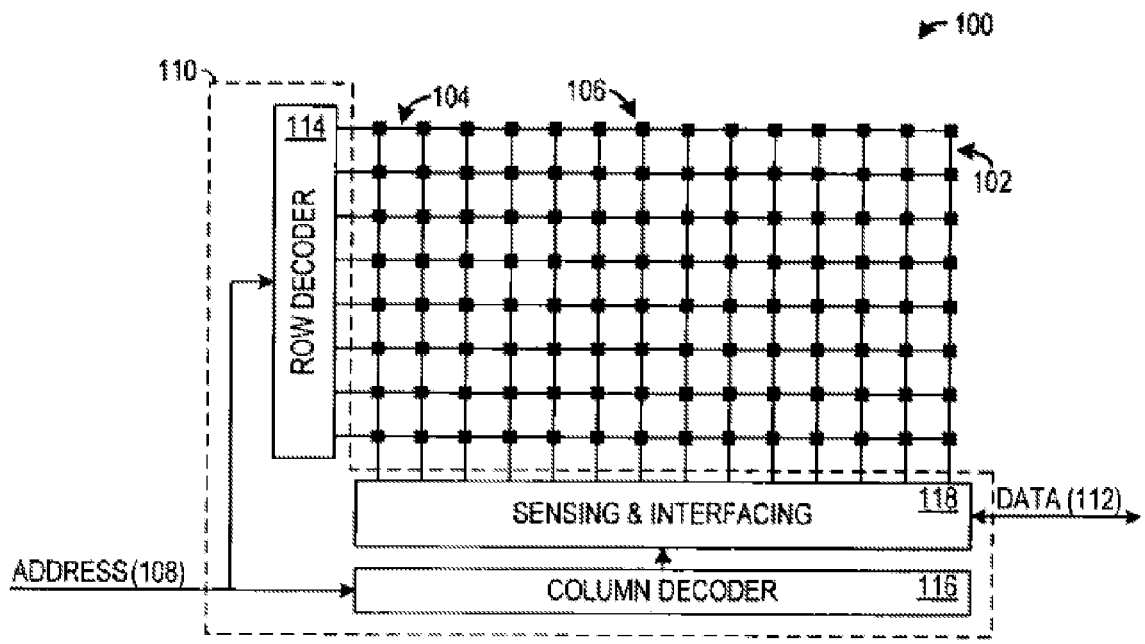
FIG. 1A schematically shows an example SRAM array, according to the prior art.

As technology has progressed, SRAM devices have become smaller and operating voltages have decreased, providing power savings and improvements in performance. However, as these parameters are reduced, the variability intrinsic in fabrication tolerances and operating conditions has a greater potential to negatively affect performance of the devices. In particular, these improvements allow storage of memory states with lower levels of charge. This, however, can increase the likelihood that the device will be affected adversely by noise sources (e.g., ambient electromagnetic noise, noise radiated by other system components, supply voltage noise, etc.), by leakage current(s), etc. Specific design challenges include ensuring the ability to reliably read from and write to cells, and to avoid inadvertent corruption of memory states during read and write operations.

Voltage assist can be used to address these challenges and ensure successful operation in the face of decreasing voltages and physical dimensions. For example, various signals, nodes, etc. can be boosted beyond a range bounded by the positive and negative supplies used to otherwise operate the memory storage cells. Ground is a reference potential and a negative supply voltage is a voltage level relative to ground that is supplied to a circuit along with a complementary positive supply voltage. The negative supply voltage is referred to as VSS and the positive supply voltage is referred to as VDD. As used herein, the term "voltage boost" and the like will be used to refer to any voltage outside the supply voltage range of a memory cell, and may therefore denote, for example, increasing a signal/node to a level above a positive supply voltage (i.e., VDD) or to a level below a negative supply voltage (i.e., VSS). The term "VSS boost" is specific to the negative supply voltage that is typically at the ground reference potential, so that VSS boost, lowers the negative supply voltage to a level that is less than ground (i.e., a negative voltage).

One prior art method of voltage assist is to continuously provide a single boosted voltage level to all of the wordlines and bitlines of the SRAM array, for example with a charge pump or other auxiliary supply. The boosted voltage level is selected at design time to account for variations in performance and behavior from cell to cell, for example as a result of device variations occurring during fabrication. The level also must take into account all of the potential operating conditions and modes. This necessarily entails increased energy use, and that assist will at times be applied when it is not needed, or at a level beyond or different than that needed for a particular wordline, bitline, or cell. Furthermore, charge pumps and the like can be relatively large in size (e.g., due to one or more large capacitors), which can negatively impact size, cost, weight, etc., of the device.

The present discussion provides for novel and improved methods for providing voltage boost, particularly boosting a negative supply voltage to a lower level. In one embodiment, the voltage boost is selectively produced and applied dynamically to one subarray of storage cells within an array of storage cells. Therefore, the voltage boost is applied to at least one row of storage cells, but not to the entire array of storage cells. The subarray-based voltage boost may be implemented using capacitive pump circuitry that is distributed within existing row decoder circuitry, thus eliminating the need for an auxiliary supply and its associated disadvantages.

Before discussing the specific boost mechanisms, an exemplary SRAM array and cell according to the prior art are described with reference to FIGS. 1A and 1B. FIG. 1A schematically depicts an example of an SRAM array 100 that includes bitlines 102 and wordlines 104, referred to generically as SRAM lines, used to access SRAM cells 106. Each cell 106 is defined at the intersection between one or more bitlines 102 and one or more wordlines 104. In typical configurations, each SRAM cell 106 is defined at the intersection of a single wordline 104 and a pair of bitlines 102, with each row of SRAM cells 106 coupled to a common wordline 104 and each column of SRAM cells 106 coupled to a common pair of bitlines 102, though other configurations are possible.

In order to interact with the memory, a cooperating unit (e.g., CPU, GPU, etc.), provides an address 108 for one or more particular SRAM cells 106, which is received and used by peripheral circuitry 110 to either read or write data 112 to the addressed SRAM cell(s). Circuitry 110 may include, for example, row decoder 114 and column decoder 116 configured to receive address 108 and thereby initiate operations to access the SRAM cell(s) identified by the address. Once the desired cell(s) have been selected, data 112 is either retrieved (read) from the addressed SRAM cell via sensing and interfacing logic 118 or provided (written) to the addressed SRAM cell via logic 118. It will be appreciated that the components illustrated in FIG. 1A are provided for the ease of understanding, and typical memory devices may include additional and/or different components in some implementations.

Figure 1B:
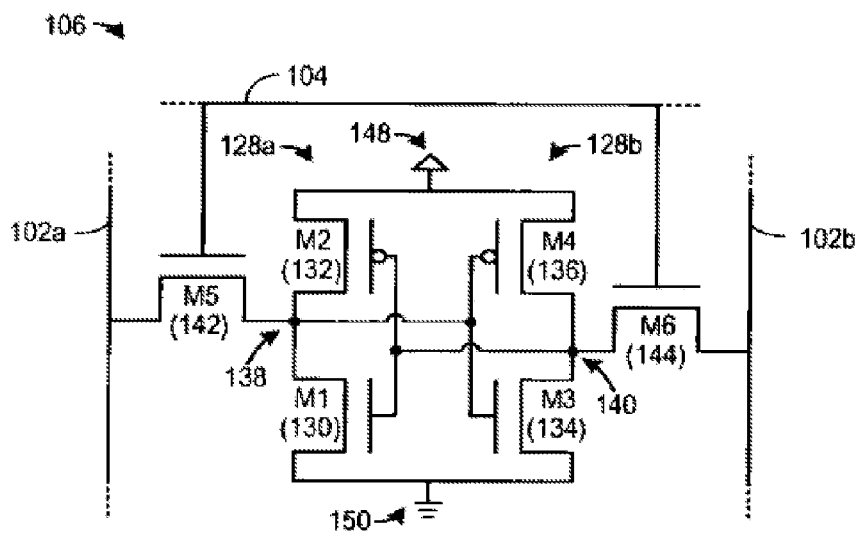
FIG. 1B schematically shows an SRAM cell of the SRAM array of FIG. 1A, according to the prior art.

Turning now to FIG. 1B, a single SRAM cell 106 of FIG. 1A is schematically shown at the transistor level. Specifically, SRAM cell 106 is illustrated as a six transistor "6T" cell, though the present discussion of voltage boosting is applicable to other SRAM configurations. For example voltage boosting techniques can be applied to an eight transistor "8T" cell. SRAM cell 106 includes a pair of cross-coupled inverters 128 for storing a single memory bit. First inverter 128a includes transistors 130 and 132; second inverter 128b includes transistors 134 and 136. The inverters cooperate to store complimentary states at storage nodes 138 and 140, with each inverter 128 reinforcing operation of the other via positive feedback. For example, if SRAM cell 106 were storing logic 1, node 138 is held at logic 1 with node 140 at logic 0.

A read of a cell 106 may proceed as follows. First, bitlines 102a and 102b are "precharged" to the positive supply voltage 148 (e.g., $V_{DD}$). Wordline 104 is then asserted to enable access to transistors 142 and 144, which respectively couples nodes 138 and 140 to bitlines 102a and 102b. Assuming node 140 is held at the negative supply (logic 0) by inverter 128b (i.e., via conduction of transistor 134) and the bitlines are no longer being actively driven, bitline 102b is discharged through transistors 134 and 144. As bitline 102b is discharged, a differential voltage is observed between bitlines 102a and 102b, since bitline 102a may remain substantially near the supply voltage due to the intrinsic capacitance of bitline 102a. This voltage differential is detectable, for example, via a differential sense amplifier coupled to the pair of bitlines 102a and 102b, and data 112 in the form of a binary digital value is provided based on the voltage differential (e.g., via sensing and interfacing logic 116).

A write of SRAM cell 106 may proceed as follows. First, one of the bitlines (e.g., bitline 102a) is driven to a desired value to be stored via driving circuitry (e.g., via circuitry 110), and bitline 102b is driven with the complimentary value. For the purpose of this example, the desired value is a logic 1, corresponding to positive supply voltage 148, and bitline 102a is therefore driven to the positive supply voltage 148 while bitline 102b is driven to negative supply voltage 150. Once the bitlines are appropriately driven, wordline 104 is asserted in order to couple SRAM cell 106 to bitlines 102. Once the access transistor is coupled, the bitline associated with a pull down voltage overpowers a corresponding inverter (e.g., transistor 142 corresponds to the first inverter 128a and transistor 144 corresponds to the second inverter 128b), thereby writing the desired value into the SRAM cell.

From the above, it will be appreciated that a reliable read operation can depend upon the ability of the SRAM cell (e.g., via NMOS transistors 130 and/or 134) to drive one of the precharged bitlines toward negative supply voltage 150 (e.g., ground). Similarly, the ability to reliably write information to the SRAM cell may rely upon the ability of one of the bitlines (e.g., via driving circuitry thereof) to pull one of nodes 138 and 140 to the negative supply voltage by overpowering one of PMOS transistors 132 and 136, depending upon the state to be written. In typical scenarios, access transistors 142 and 144 are sized smaller than NMOS transistors 130 and 134, so as to ensure that the access transistors do not overpower the NMOS transistors during a read operation and corrupt the stored information. Similarly, the access transistors may be sized larger than PMOS transistors 132 and 136 so as to ensure that the PMOS transistors, and thus the cross-coupled inverters, are able to be overpowered during a write operation.

However, as mentioned above, variations in fabrication and/or in operating conditions (e.g., temperature) may result in significant variation in the performance of individual transistors. Accordingly, SRAM cell 106 may be sized according a worst-case scenario, for example, by increasing the relative sizing of the various transistors. Such a configuration may provide the desired read/write reliability at the expense of size and/or performance (e.g., due to increased time to vary charge at the various nodes).

It may therefore be desirable to selectively provide voltage assist to SRAM cell(s) 106 of memory device 100 on an as-needed basis, thereby potentially enabling smaller cell sizing and/or decreased power consumption without sacrificing read/write reliability. As illustrated, a typical SRAM cell is supplied with five "signals," namely two bitline signals 102, one wordline signal 144, a positive supply 148, and a negative supply 150 (e.g., ground). Accordingly, adjustment of any one or more of these signals may aid performance.

Figure 2A:
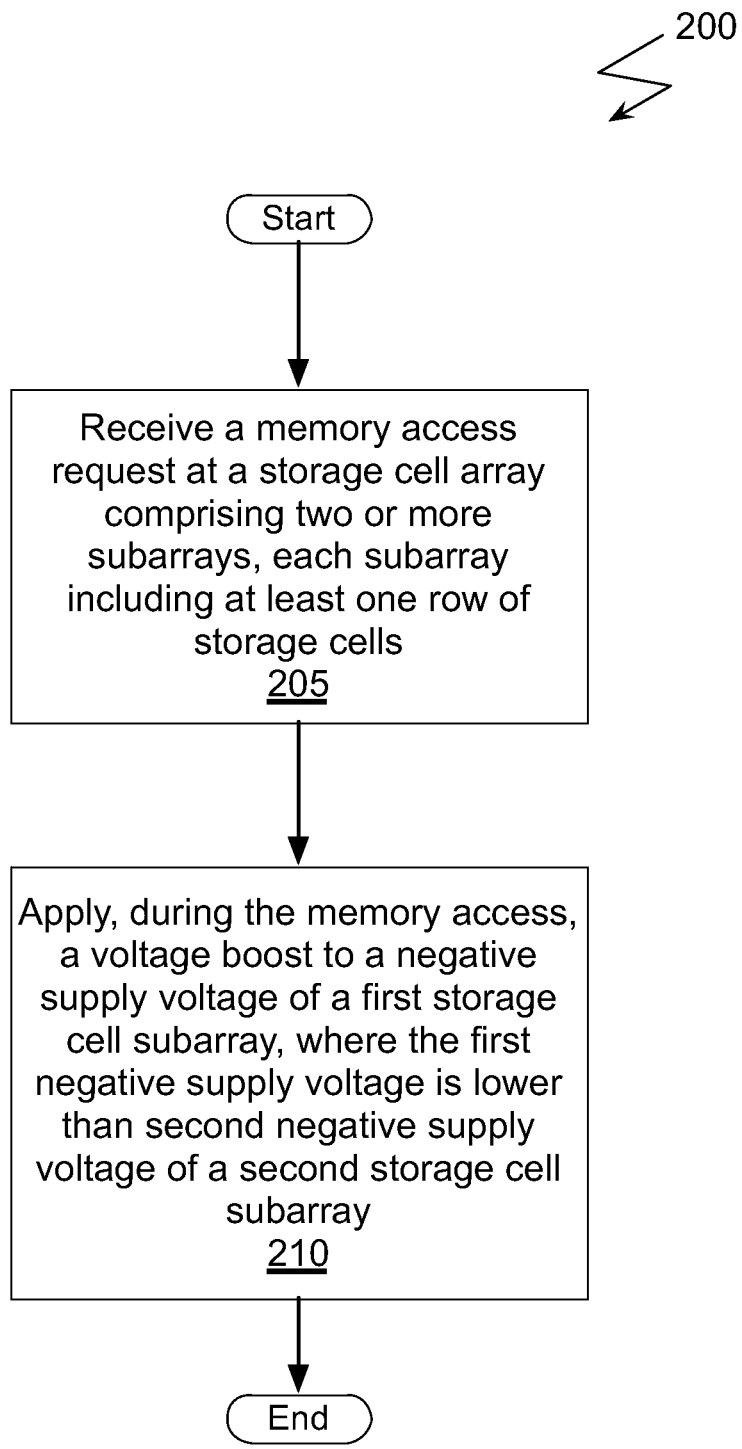
FIG. 2A illustrates a flowchart of a method for performing memory access assist using voltage boost, in accordance with one embodiment.

FIG. 2A illustrates a flowchart of a method 200 for performing memory access assist using voltage boost, in accordance with one embodiment. At step 205, a memory access request is received at a storage cell array that comprises two or more subarrays, each subarray including at least two rows of storage cells. In the context of the following description, a memory access request may specify a read operation or a write operation for a particular address, where the address corresponds to at least one storage cell in a row of storage cells.

At step 210, during the memory access, a voltage boost is applied to a first negative supply voltage of a first storage cell subarray of the two or more storage cell subarrays. The first negative supply voltage of the first storage cell subarray is lower than a second negative supply voltage of a second storage cell subarray of the two or more storage cell subarrays. The access assist (i.e., voltage boost) may be enabled or disabled based on a condition including one or more of a power configuration of the SRAM array and the type of the particular operation being performed (e.g., read or write).

More illustrative information will now be set forth regarding various optional architectures and features with which the foregoing technique may or may not be implemented, per the desires of the user. It should be strongly noted that the following information is set forth for illustrative purposes and should not be construed as limiting in any manner. Any of the following features may be optionally incorporated with or without the exclusion of other features described.

Applying a voltage boost to a row of storage cells being read typically improves performance (i.e., speed) because lowering the first negative supply voltage provided to the row of storage cells produces a similar result as performing access assist by both increasing a positive supply voltage and increasing the wordline voltage. Specifically, the current that drives the bitlines is increased. Read upset may occur during a read or write operation when contents of one or more cells are inadvertently changed during the read or write operation. Read upset may be reduced when voltage boost is used. However, applying voltage boost to a row of storage cells being written does not necessarily improve performance for write operations. Therefore, in addition to boosting the first negative supply voltage provided to a subarray within an array of storage cells, performance for write operations may be improved by boosting bitlines below the second negative supply voltage. The lowered level of the first negative supply voltage (compared with the second negative supply voltage) that is generated for the voltage boost may also be used to boost voltages of bitlines for a write operation. The ability of the access transistors (e.g., access transistors 142 and 144 shown in FIG. 1B) to conduct current increases with an increasing gate-to-source voltage differential: thus, increased current conduction is possible by increasing the gate voltage (e.g., increasing wordline voltage) and/or decreasing the source voltage (e.g. decreasing bitline voltage). In the following description, voltage boosting bitlines refers to lowering voltages applied to bitlines that would be at the second negative supply voltage to the first negative supply voltage, where the first negative supply voltage is a voltage level that is lower than the second negative supply voltage.

Figure 2B:
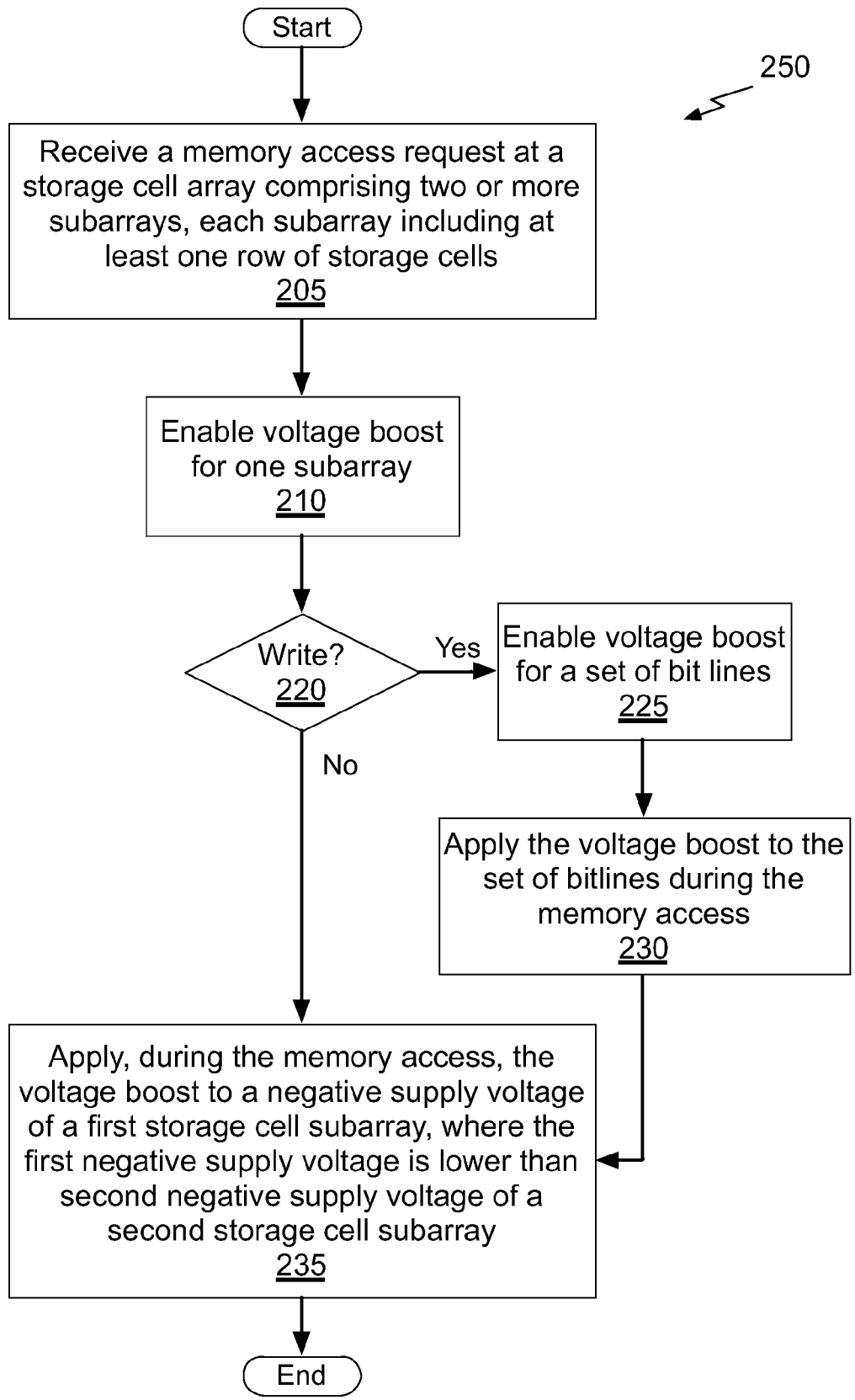
FIG. 2B illustrates a flowchart of another method for performing memory access assist using voltage boost, in accordance with one embodiment.

FIG. 2B illustrates a flowchart of a method 250 for performing memory access assist using voltage boost, in accordance with one embodiment. Step 205 is performed as described in conjunction with FIG. 2A. At step 210, the voltage boost is enabled for a first storage cell subarray of the two or more storage cell subarrays. At step 220, the operation specified by the memory access request is determined, and if a write operation is specified, then, at step 225, voltage boost is enabled for a set of bitlines coupled to the first storage cell subarray. At step 230, the voltage boost is applied during the memory access that performs a write operation to boost a voltage applied to a set of bitlines that are coupled to the first storage cell subarray. At step 235, during the memory access, a voltage boost is applied to a first negative supply voltage of the first storage cell subarray. The first negative supply voltage of the first storage cell subarray is lower than a second negative supply voltage of a second storage cell subarray of the two or more storage cell subarrays. In one embodiment, the voltage boost is applied to the set of bitlines and voltage boost is not applied to the first negative supply voltage.

Figure 3A:
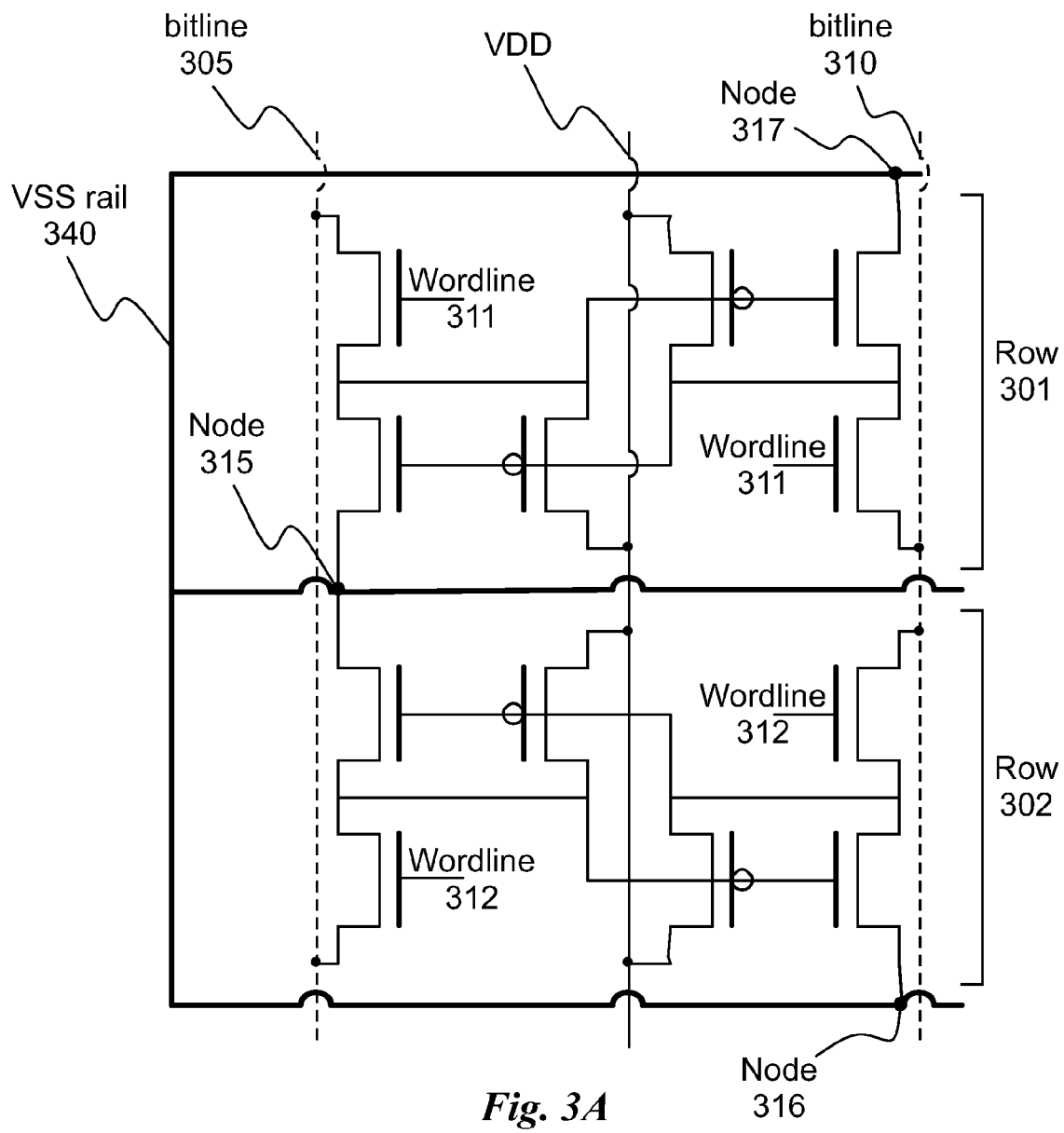
FIG. 3A schematically shows an example of two storage cells in adjacent rows of a storage cell array, in accordance with one embodiment.

FIG. 3A schematically shows an example of two storage cells in adjacent rows of a storage cell array, in accordance with one embodiment. A first storage cell is in row 301 and a second storage cell is in row 302. The adjacent storage cells share the same VSS rail 340 for a negative supply voltage VSS and are both storage cells are coupled to the VSS rail 340 at nodes 315, 316, and 317. Each storage cell is also coupled to a positive supply voltage VDD and a pair of bitlines including a bitline 305 and a bitline 310. Access transistors in the first storage cell are coupled to a wordline 311 that is asserted to perform read and write operations for the row 301. Access transistors in the second storage cell are coupled to a wordline 312 that is asserted to perform read and write operations for the row 302.

The topology of the transistors shown in FIG. 3A is consistent with the topology of the physical layout of the array of storage cells. The VSS rail 340 and the wordlines 311 and 312 are typically routed in the same direction (e.g., horizontally) and are coupled to each storage cell in a row. In contrast, VDD and the bitlines 305 and 310 are routed in the opposing direction (e.g., vertically) and are coupled to each storage cell in a column. Controlling the relative timing between the wordline assertion and voltage boost can be more precise because the routing of the signals is similar and the generation of the signals may occur at the same edge of the array of storage cells (i.e., in the row decoder logic). Because the VSS rail 340 is shared between adjacent rows in the array, a single row of storage cells cannot be easily isolated so that voltage boost is applied only to a single row. A technique for decoupling adjacent rows from a shared VSS is shown in FIG. 3C.

Figure 3B:
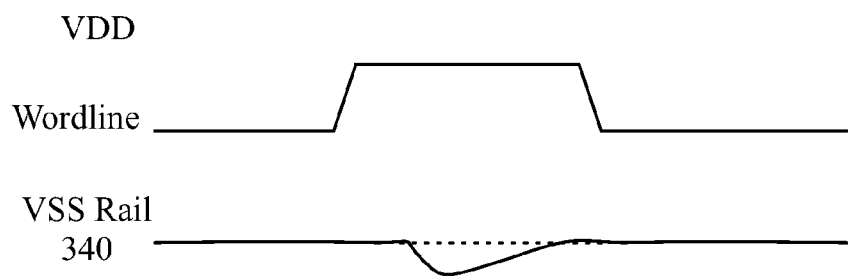
FIG. 3B shows example waveforms occurring when voltage boost is applied to the circuitry of FIG. 3A, in accordance with one embodiment.

FIG. 3B shows example waveforms occurring when voltage boost is applied to the circuitry of FIG. 3A, in accordance with one embodiment. VDD is held substantially constant at a positive supply voltage. When a wordline is asserted to perform a read or write operation, after a suitable amount of time the VSS rail 340 is boosted to a voltage level that is lower than the negative supply voltage. Otherwise, the VSS rail 340 is at the voltage level of the negative supply voltage (shown as a dotted line).

Figure 3C:
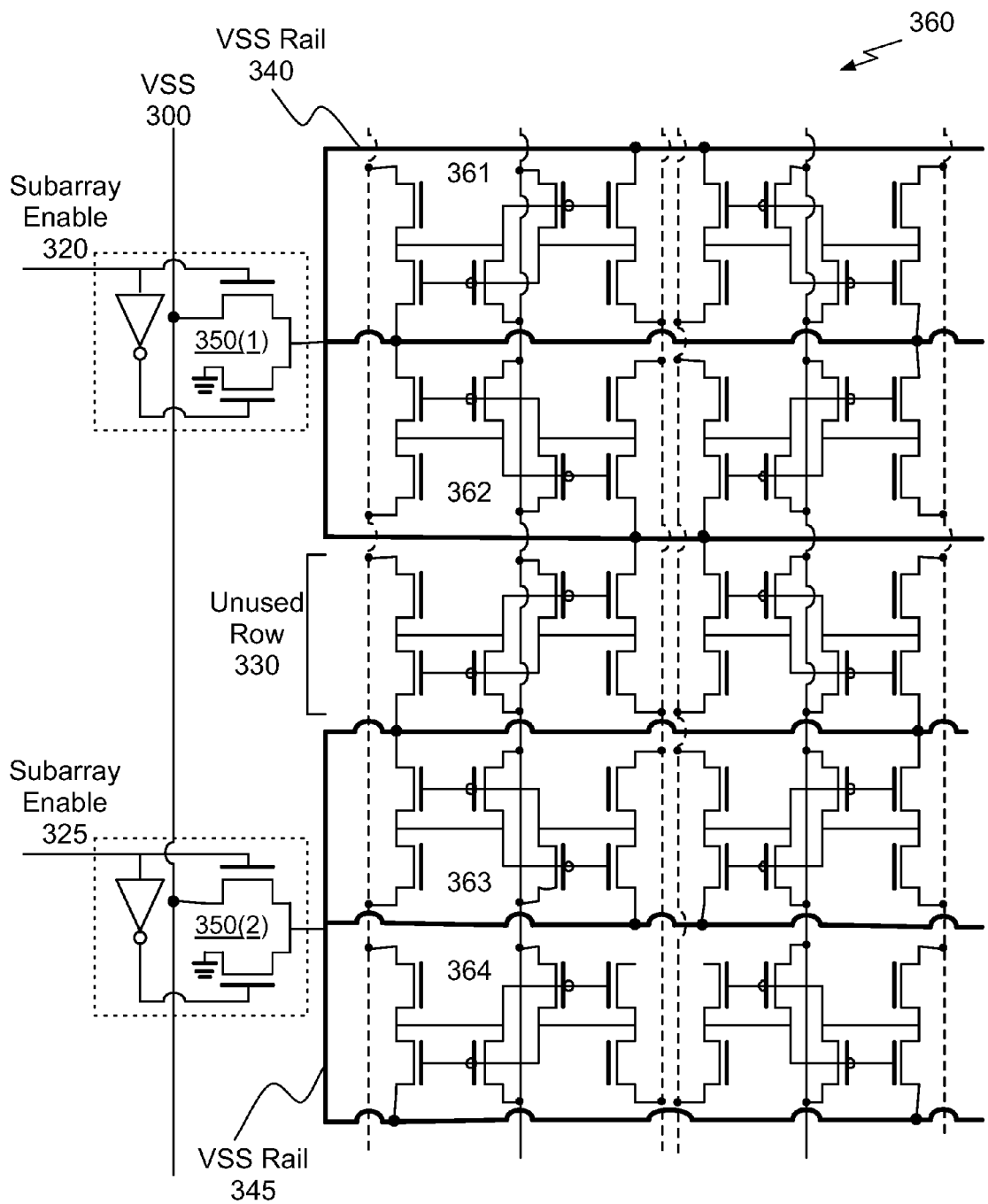
FIG. 3C schematically shows an example of two different subarrays within a storage cell array, in accordance with one embodiment.

FIG. 3C schematically shows an example of two different subarrays 360 within a storage cell array, in accordance with one embodiment. A first subarray includes rows 361 and 362 that are coupled to a VSS rail 340 and a second subarray includes rows 363 and 364 that are coupled to a VSS rail 345. An unused row 330 is used to decouple the VSS rail 340 from the VSS rail 345. If the unused row 330 is used to store data, then half of each storage cell in the row will be boosted when voltage boost is applied to the VSS rail 340 and the other half of each storage cell in the row will be boosted when voltage boost is applied to the VSS rail 345. Asymmetric boosting of VSS may cause read upset. Therefore, storage cells in the unused row 330 should not be used to store data when voltage boosting is applied to either the first subarray or the second subarray. The wordline coupled to the access transistors in the unused row 330 may be coupled to a third VSS rail so that the bitlines are not unintentionally driven by storage cells in the unused row 330.

If asymmetric boosting of VSS is not a problem (i.e., if the amount of voltage boost is small enough and/or the storage cells are robust enough that an asymmetric voltage boost does not cause read or write upsets), then the unused row 330 may be used to store data. However, when the unused row 330 is used to store data, voltage boost should be simultaneously applied to VSS rails 340 and 345.

An unused row 330 may be implemented between each used row to produce subarrays that are each a single row in size. Unused rows 330 may be implemented between two or more used rows to produce subarrays that are N rows in size, where N is a positive integer. In one embodiment N=8. In other embodiments N=16 or 32. As N decreases, the area efficiency of the memory cell array increases, the amount of voltage boost provided to each row increases, and the power consumed during voltage boost decreases (assuming that voltage boost is applied to only one subarray at a time). As the number of rows included in each subarray increases, the resistance of the associated VSS rail decreases and the capacitance increases.

An alternative to inserting unused rows is to modify the storage cell so that a storage cell may be decoupled from a boosted VSS rail when only one of the VSS rails coupled to the storage cell is boosted. However, this alternative requires the inclusion of at least one more transistor and routing of a disable signal to each storage cell in a row. Therefore, modifying the storage cells may be more costly in terms of circuit area compared with inserting unused rows. Another solution is to modify the physical layout of each storage cell so that VSS rails are not shared between adjacent rows of storage cells. Again, the circuit area that is needed to route separate VSS rails to each row of storage cells may be more costly in terms of circuit area compared with inserting unused rows.

Returning to FIG. 3C, a first negative supply voltage, VSS 300 may be configured to implement voltage boost, so that the VSS 300 is reduced when a row of the memory array is accessed. A subarray boost enable circuit 350 is coupled to each VSS rail for a subarray. Each subarray boost enable circuit 350 receives VSS 300 as an input and a second negative supply voltage (represented by the ground symbol in the subarray boost enable circuit 350). The subarray boost enable circuit 350(1) receives a subarray enable 320 signal that is configured to enable voltage boost for the first subarray including rows 361 and 362. When subarray enable 320 is asserted, the VSS 300 is coupled to the VSS rail 340. When subarray enable 320 is negated, the second negative supply voltage is coupled to the VSS rail 340 and the voltage boost is not applied to the first subarray. The subarray boost enable circuit 350(2) receives a subarray enable 325 signal that is configured to enable voltage boost for the second subarray including rows 363 and 364. When subarray enable 325 is asserted, the VSS 300 is coupled to the VSS rail 345. When subarray enable 325 is negated, the second negative supply voltage is coupled to the VSS rail 345 and the voltage boost is not applied to the second subarray.

Only one of the subarray enable signals 320 and 325 should be asserted for a particular read or write operation. Row decode logic is configured to assert the subarray enable signal corresponding to the row that is accessed. In one embodiment, the subarray enable signals 320 and 325 are generated in such a way as to be asserted a suitable amount of time before VSS 300 is boosted.

Figure 4A:
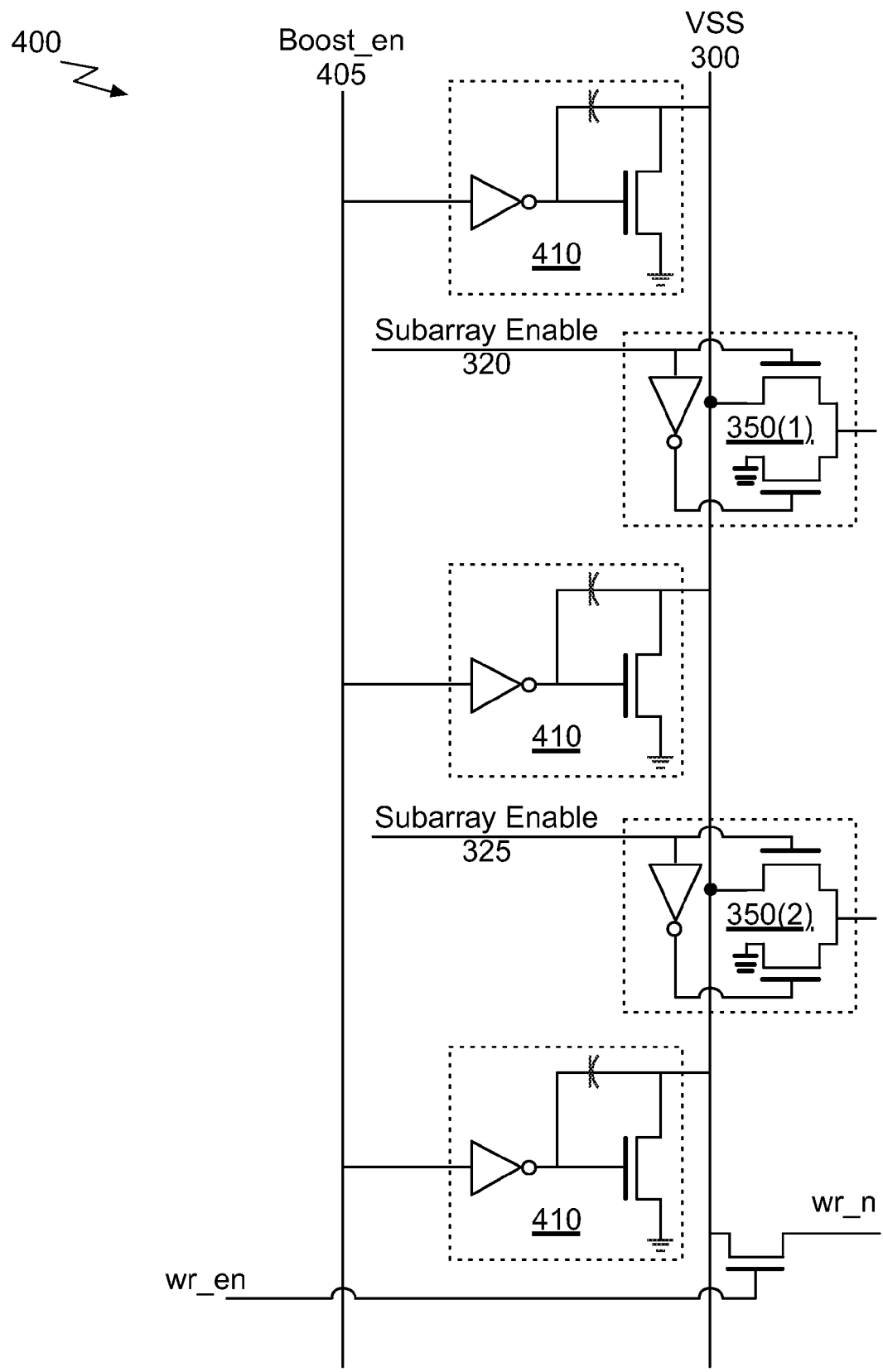
FIG. 4A schematically shows an access assist circuit for providing voltage boost to two different subarrays and to a set of bitlines for write operations, in accordance with one embodiment.

FIG. 4A schematically shows an access assist circuit 400 for providing voltage boost to two different subarrays and voltage boost to a set of bitlines for write operations, in accordance with one embodiment. The access assist circuit 400 includes one or more voltage pump circuits 410 and the subarray boost enable circuits 350. The particular implementation of the voltage pump circuit 410 shown in FIG. 4A is an example circuit that may be replaced with another implementation in other embodiments. One or more voltage pump circuits 410 may be distributed within row decode circuitry for the memory storage array. As shown in FIG. 4A, the subarray boost enable circuits 350 may also be distributed within the row decode circuitry. The row decode circuitry is typically positioned at the edge of the memory storage array which is a convenient location for the generation of VSS 300. VSS 300 can then be routed to each of the horizontal VSS rails associated with one or more rows in the memory storage array. Existing decoded (or partially decoded row) addresses available in the row decode circuitry may be used to generate the subarray enable 320 and 325 signals so that existing circuitry is reused.

When boost_en 405 is negated to disable voltage boost, the terminal of a capacitor within each voltage pump circuit 410 that is coupled between an inverter output and the gate of a transistor is pulled to the positive supply voltage. The transistor is enabled so that current flows between the second negative supply voltage and VSS 300. VSS 300 is restored to the second negative supply voltage, so that a voltage difference is produced across the capacitor that substantially equals the difference between the positive and the second negative supply voltages.

When boost_en 405 is asserted to enable voltage boosting, the terminal of the capacitor coupled between an inverter output and the gate of a transistor is pulled to the second negative supply voltage. The transistor is disabled so that current does not flow between the second negative supply voltage and VSS 300. As the terminal of the capacitor is discharged to the second negative supply voltage by the inverter, the opposing terminal that is coupled to VSS 300 is pulled to a voltage level that is lower than the second negative supply voltage, producing the voltage boost at VSS 300.

The voltage boosted first negative supply voltage, VSS 300 may also be applied to the bitlines. A wren signal is asserted for write operations to couple a wr_n signal to VSS 300. The wr_n signal is selectively coupled to one of the two bitlines 305 and 310 of a bitline pair (shown in FIG. 3A). Operation of the wr_n signal is described in further detail in conjunction with FIGS. 5A and 5B. In sum, the current conducted by an NMOS FET access transistor of a storage cell increases with the voltage differential between the gate terminal (e.g., wordline signal) and the source terminal (e.g., via bitline(s) 305 and 310) of the access transistors. The illustrated access assist circuit 400 of FIG. 4A is configured to decrease a voltage level of the signal applied to bitline(s) 305 and 310 below the level of the second negative supply to improve performance of the SRAM cells being written.

Figure 4B:
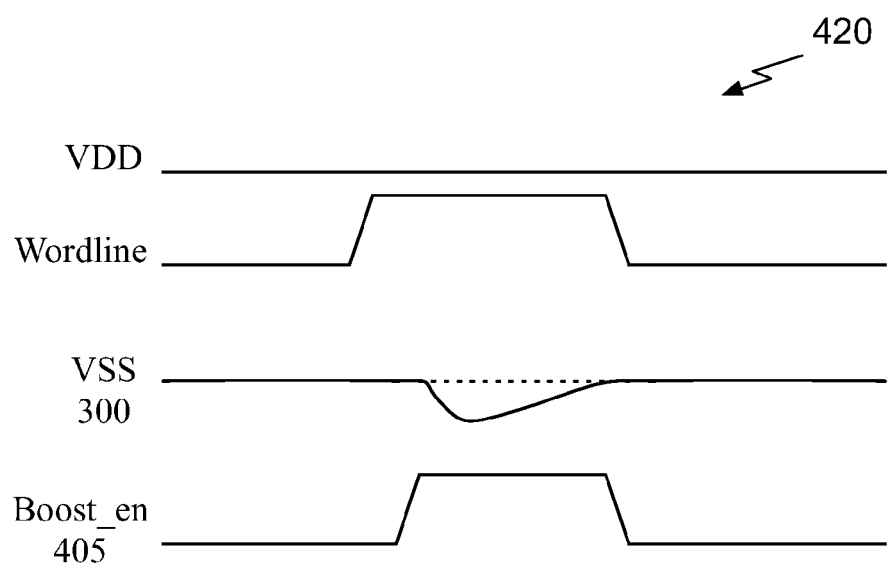
FIG. 4B shows example waveforms occurring when voltage boost is generated by the circuitry of FIG. 4A, in accordance with one embodiment.

FIG. 4B shows example waveforms 420 occurring when voltage boost is generated by the access assist circuit 400 of FIG. 4A, in accordance with one embodiment. The boost_en 405 is delayed relative to the assertion of a wordline signal because applying the voltage boost early can cause a functional failure during the read or write operation. If boost_en 405 is asserted early, VSS 300 may be driven positive because the capacitors will have completely discharged. Therefore, the boost_en 405 is delayed so that most of the bitlines will have been discharged. However, delaying the boost_en 405 too much relative to the wordline signal can limit the efficacy of the voltage boost. Therefore, boost_en 405 should asserted as early as possible and for as short of a duration as possible.

In one embodiment, the voltage boost may be separately enabled for read and write operations by generating the boost_en 405 based on the operation type. Therefore, voltage boost may be applied for both read and write operations, only for read operations, or only for write operations. In one embodiment, voltage boost may be applied to bitlines with or without the voltage boost to a VSS rail, and should be applied only for write operations.

Figure 4C:
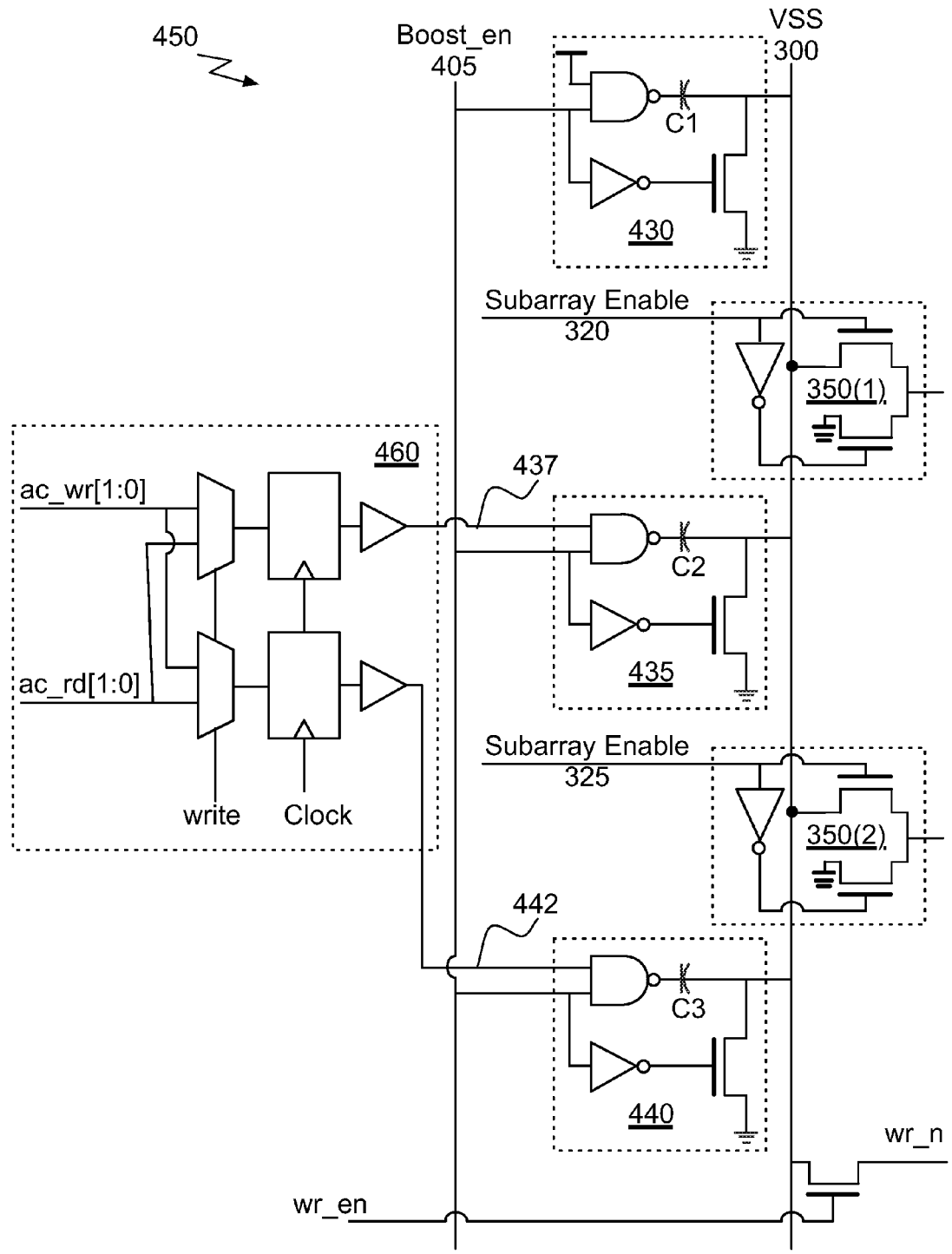
FIG. 4C schematically shows an access assist circuit for providing variable levels of voltage boost to one subarray and voltage boost to a set of bitlines for write operations, in accordance with one embodiment.

FIG. 4C schematically shows an access assist circuit 450 for providing variable levels of voltage boost to one subarray and voltage boost to the set of bitlines for write operations, in accordance with one embodiment. The access assist circuit 450 includes the subarray boost enable circuits 350 and one or more voltage pump circuits 430, 435, and 440. One or more voltage pump circuits 430, 435, and 440 may be distributed within row decode circuitry for the memory storage array. As shown in FIG. 4C, the subarray boost enable circuits 350 may also be distributed within the row decode circuitry. In one embodiment, the subarray boost enable circuits 350 are not distributed within the row decode circuitry.

A specific amount of voltage boost may be provided by controlling the size of the capacitance that is coupled to VSS 300 when boost_en 405 is asserted. Specifically, the amount of voltage boost that is induced depends upon the relative sizing of the boost capacitor to the intrinsic capacitance of the VSS rail coupled to the subarray to which the voltage boost is applied. The boost capacitor is a combination of the accumulated capacitance of one or more of the capacitors C1, C2, and C3 within the voltage pump circuits 430, 435, and 440, respectively. As the boost capacitance increases in relation to the capacitance of the coupled VSS rail, the amount of voltage boost that may be provided also increases. Increasing the size of the boost capacitor enables the boost capacitor to store more charge, and to therefore produce a larger change in the voltage on the coupled VSS 300 when boost_en 405 is asserted to cause the capacitive charge coupling/sharing.

The amount of boost capacitance may be dynamically selected during operation of the SRAM. Various considerations can affect the selection of the boost capacitance to dynamically provide different boost levels. The voltage boost that is provided should be reduced at higher positive supply voltage levels. In one embodiment, the subarray boost may be turned off to reduce power consumption when the positive supply voltage is at or above a predetermined voltage level.

As shown in FIG. 4C, each voltage pump circuit 430, 435, and 440 includes a NAND gate that receives the boost_en 405. The voltage pump circuit 430 is configured to provide voltage boost whenever boost_en 405 is asserted. The voltage pump circuits 435 and 440 are configured to receive respective signals 437 and 442 that control whether the respective voltage pump circuit provides voltage boost whenever boost_en 405 is asserted. Therefore, possible values of the boost capacitance are C1, C1+C2, C1+C3, and C1+C2+C3. In some embodiments, each capacitor C1, C2, and C3 is equal in value, so that each voltage pump circuit 430, 435, and 440 can provide one "unit" of capacitance. The capacitor configuration shown in FIG. 4C is just one example of a possible implementation. In other embodiments, one or more of the capacitors may have different values and additional or fewer capacitors may be used.

Boost logic 460 may be provided to control the enabling of a selected amount of boost capacitance. As shown in FIG. 4C, ac_wr[1:0] defines the amount of boost capacitance that will be employed during write operations (i.e., when wr_en is asserted) and is 2 bits wide, where each bit corresponds to one of the voltage pump circuits 435 and 440. Accordingly, ac_wr[1:0] can be used to select anywhere from 0 to 2 units of capacitance in addition to C1 (assuming the capacitors C1, C2, and C3 are equally sized). In other embodiments, ac_wr and/or ac_rd may be more than two bits wide so that a wider range of boost capacitances may be selected. ac_rd[1:0] defines the amount of boost capacitance that will be employed during read operations (i.e., when write is negated) and is also 2 bits wide, where each bit corresponds to one of the voltage pump circuits 435 and 440. Accordingly, ac_rd[1:0] can be used to select anywhere from 0 to 2 units of capacitance in addition to C1 (assuming the capacitors C1, C2, and C3 are equally sized).

As previously described in conjunction with FIG. 4A, VSS 300 may also be applied to the bitlines. The wr_en signal is asserted for write operations to couple the wr_n signal to VSS 300. The wr_n signal is selectively coupled to one of the two bitlines 305 and 310 of a bitline pair (shown in FIG. 3A). The illustrated access assist circuit 450 of FIG. 4C is configured to decrease a voltage level of the signal applied to bitline(s) 305 and 310 below the level of the second negative supply voltage to improve performance of the SRAM cells being written.

Figure 5A:
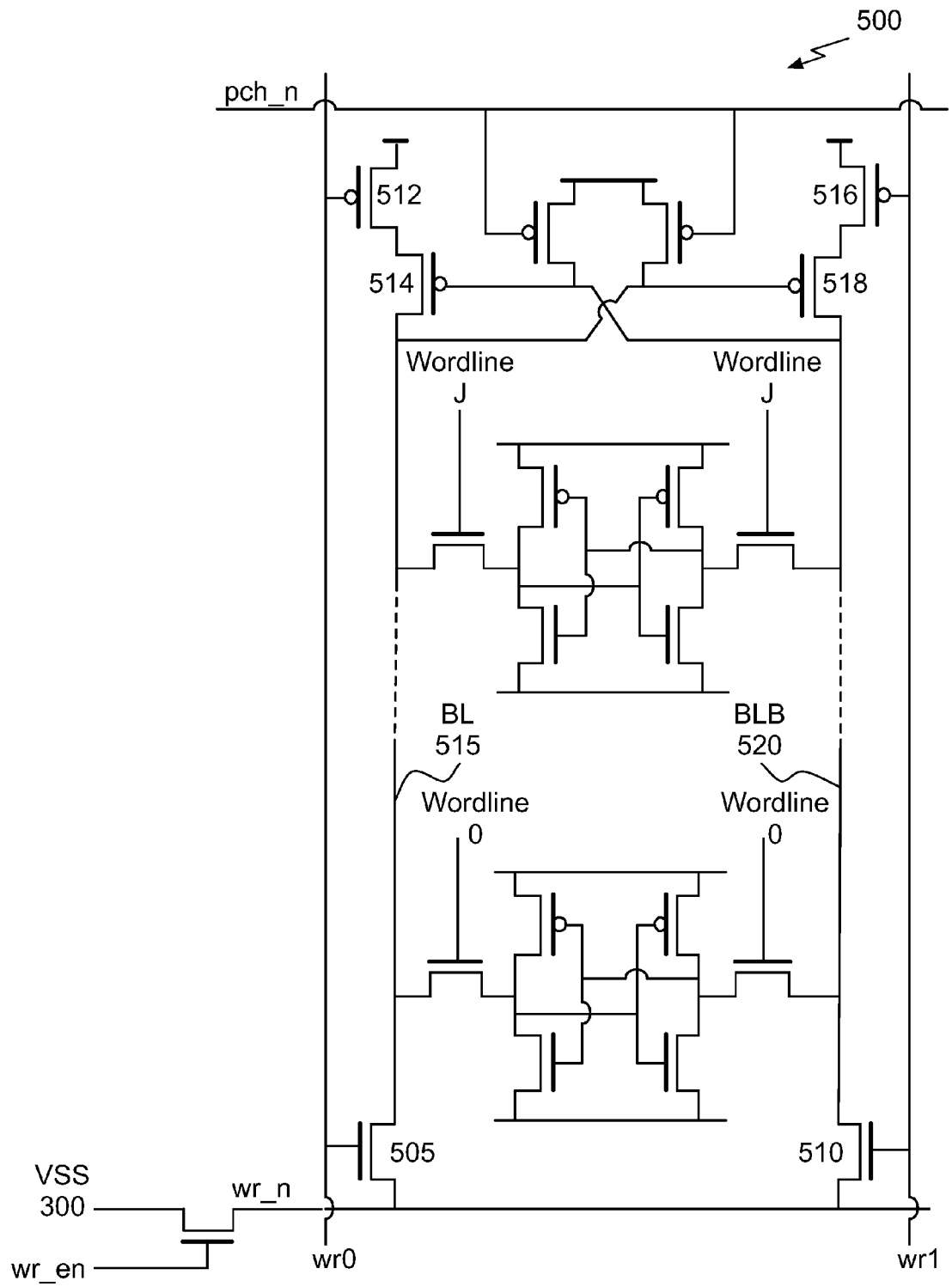
FIG. 5A schematically shows access assist circuitry for providing voltage boost to the set of bitelines for write operations, in accordance with one embodiment.

FIG. 5A schematically shows access assist circuitry 500 for providing voltage boost to the set of bitlines for write operations, in accordance with one embodiment. When wr_en is asserted, VSS 300 is coupled to wr_n to provide voltage boost to the bitline BL 515 and the bitline BLB 520 that are provided to a subarray of the memory storage array. The wr_n is provided to each column in the memory storage array that includes at least one storage cell to be written. The bitlines BL 515 and BLB 520 may be routed to storage cells in one or more subarrays.

The bitlines BL 515 and BLB 520 are precharged to the positive supply voltage VDD before a storage cell is coupled to the bitlines via one or more access transistors having gates coupled to a wordline signal (e.g., wordline O or wordline J). For example, first an active-low pch_n signal is asserted (i.e., at a low voltage level) to precharge the bitlines BL 515 and BLB 520 to the positive supply voltage. Next, the active-low pch_n signal is deasserted (i.e., at a high voltage level) to disconnect the bitlines BL 515 and BLB 520 from the positive supply voltage. The wordline signal is then asserted. The wordline is typically deasserted before the bitlines BL 515 and BLB 520 are precharged for the next read or write operation. It will be appreciated that each bitline BL 515 and BLB 520 has an intrinsic capacitance that maintains the bitline near the positive supply voltage for a time upon deasserting the pch_n signal.

Once the bitlines are decoupled from the positive supply voltage, one of signals wrO and wrl is asserted in order to enable either transistor 505 or 510, respectively, depending on whether a logic 1 or logic 0 is being written to the addressed storage cell. For ease of understanding, description of the voltage boost circuitry will continue with reference to driving bitline BLB 520 towards the first negative supply voltage by asserting active-high signal wrl applied to transistor 510. The wr_n and the wrO or wrl signal is asserted before and/or after the wordline signal is asserted.

The voltage on bitline BLB 520 begins to fall as the current being conducted though transistor 510 discharges the intrinsic capacitance of bitline BLB 520. When the bitline BLB 520 is discharged to the voltage level of the second negative supply voltage, the voltage boost is applied and VSS 300 falls below the second negative supply voltage. Hence, the bitline BLB 520 also falls below the second negative supply voltage. The bitline BL 515 is pulled up to the positive supply voltage through the transistors 512 and 514 as the bitline BLB 520 is pulled low. The boosted voltage on bitline BLB 520 provides the voltage assist that may be needed to ensure that the access transistors provide sufficient current to operate as desired. Once the write operation has been performed, wr_en is deasserted and the active-low pch_n signal asserted to return the bitlines BL 515 and BLB 520 to the level of the positive supply voltage. In one embodiment, transistors 512 and/or 514 are omitted and transistors 516 and/or 518 are omitted.

Figure 5B:
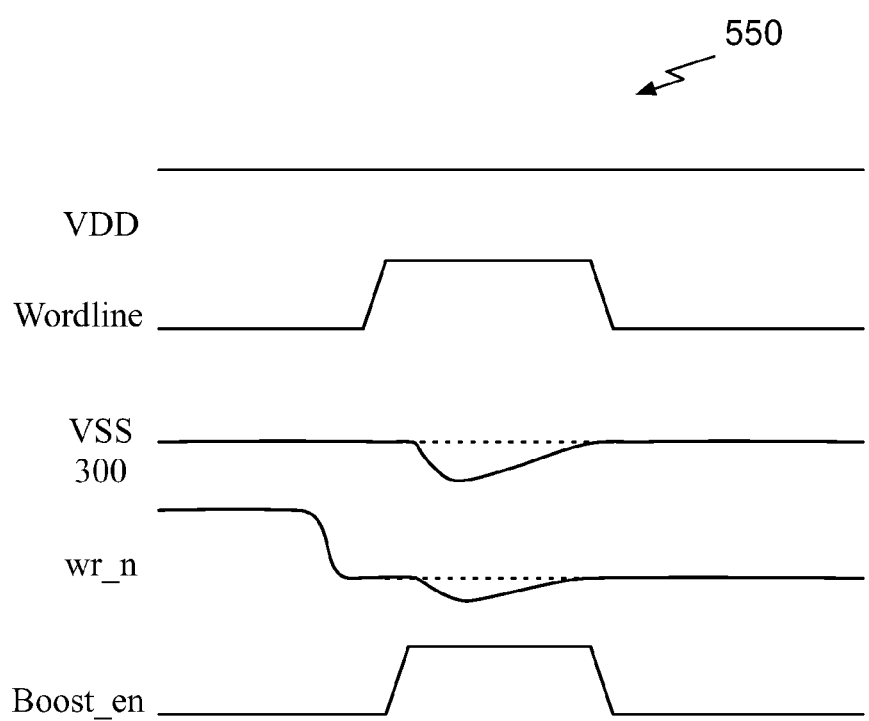
FIG. 5B shows example waveforms occurring when voltage boost is provided to the first negative supply voltage and the set of bitlines by the access assist circuits of FIGS. 4A and 4C, in accordance with one embodiment.

FIG. 5B shows example waveforms 550 occurring when voltage boost is provided to the first negative supply voltage and the set of bitlines by the access assist circuits of FIGS. 4A and 4C, in accordance with one embodiment. VDD is held substantially constant at a positive supply voltage. When a write operation is performed, the wr_n is coupled to VSS 300 to discharge either BL 515 or BLB 520 to the second negative supply voltage. Then the wordline signal is asserted to transfer the data being written to the storage cells associated with the wordline signal.

The boost_en 405 is delayed relative to the assertion of the wordline signal. When boost_en is asserted, VSS 300 is boosted from the second negative supply voltage to the first negative supply voltage that is lower than the second negative supply voltage. Otherwise, the VSS rail 340 is at the voltage level of the second negative supply voltage (shown as a dotted line). Because wr_n is coupled to VSS 300, wr_n is also boosted to the first negative supply voltage. When boost_en 405 is deasserted, VSS 300 is restored to the second negative supply voltage and the wordline is also deasserted to complete the write operation.

Figure 6:
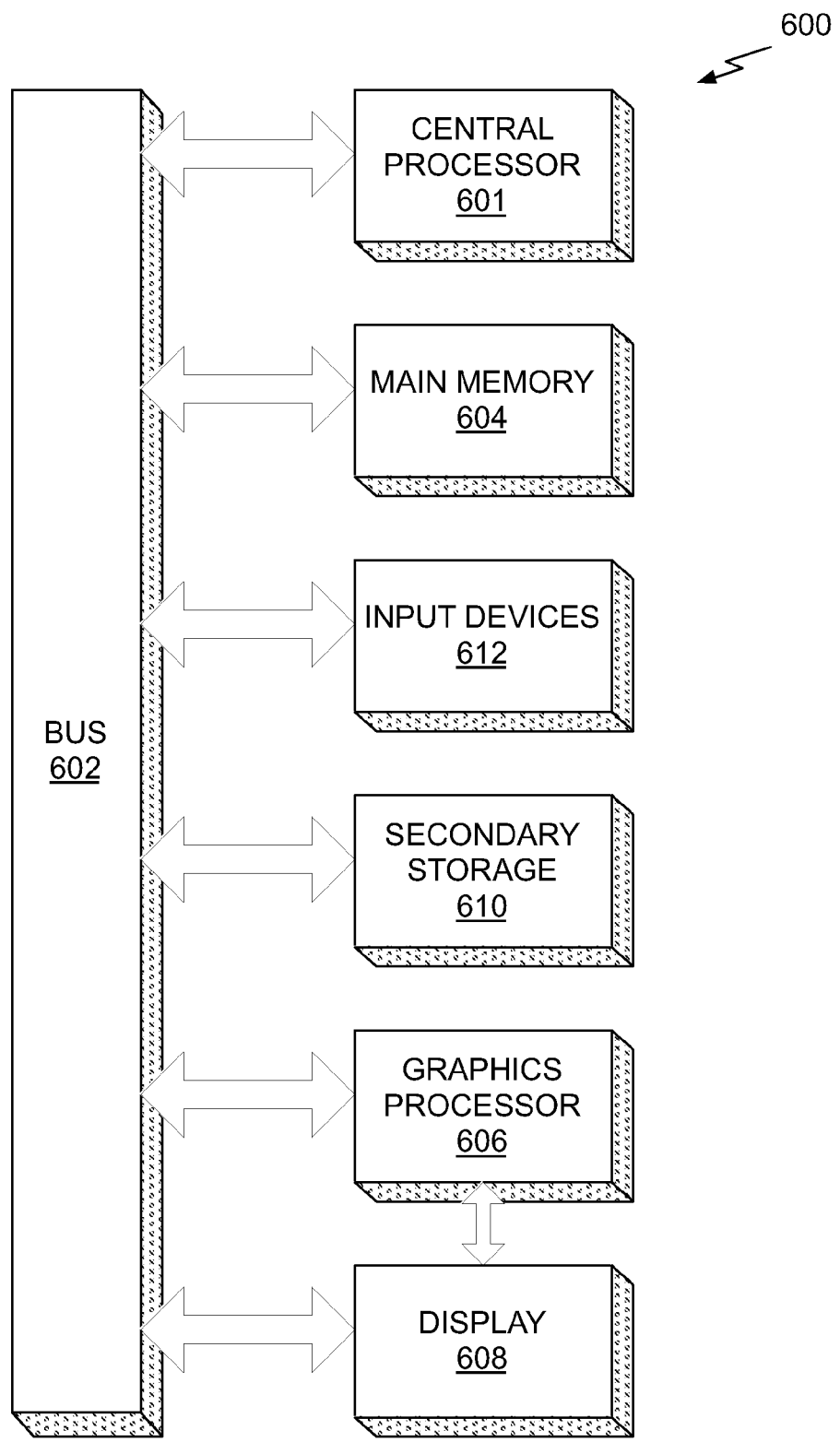
FIG. 6 illustrates an exemplary system in which the various architecture and/or functionality of the various previous embodiments may be implemented.

FIG. 6 illustrates an exemplary system 600 in which the various architecture and/or functionality of the various previous embodiments may be implemented. In particular, the voltage boost access assist technique implemented by the access assist circuits 400 and/or 450 may be employed for one or more of the memory or register elements that rely on SRAM storage circuitry. As shown, a system 600 is provided including at least one central processor 601 that is connected to a communication bus 602. The communication bus 602 may be implemented using any suitable protocol, such as PCI (Peripheral Component Interconnect), PCI-Express, AGP (Accelerated Graphics Port), HyperTransport, or any other bus or point-to-point communication protocol(s). The system 600 also includes a main memory 604. Control logic (software) and data are stored in the main memory 604 which may take the form of random access memory (RAM).

The system 600 also includes input devices 612, a graphics processor 606, and a display 608, i.e. a conventional CRT (cathode ray tube), LCD (liquid crystal display), LED (light emitting diode), plasma display or the like. User input may be received from the input devices 612, e.g., keyboard, mouse, touchpad, microphone, and the like. In one embodiment, the graphics processor 606 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 600 may also include a secondary storage 610. The secondary storage 610 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 604 and/or the secondary storage 610. Such computer programs, when executed, enable the system 600 to perform various functions. The memory 604, the secondary storage 610, and/or any other storage are possible examples of computer-readable media.

In one embodiment, the architecture and/or functionality of the various previous figures may be implemented in the context of the central processor 601, the graphics processor 606, an integrated circuit (not shown) that is capable of at least a portion of the capabilities of both the central processor 601 and the graphics processor 606, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 600 may take the form of a desktop computer, laptop computer, server, workstation, game consoles, embedded system, and/or any other type of logic. Still yet, the system 600 may take the form of various other devices including, but not limited to a personal digital assistant (PDA) device, a mobile phone device, a television, etc.

Further, while not shown, the system 600 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method comprising:
receiving a memory access request at a storage cell array comprising two or more storage cell subarrays, each storage cell subarray including at least one row of storage cells, wherein the memory access request specifies a read operation or a write operation and a voltage boost is applied during both read and write operations; and
applying, during the memory access, the voltage boost to a first negative supply rail of a first storage cell subarray of the two or more storage cell subarrays, wherein a boosted voltage of the first negative supply rail of the first storage cell subarray is lower than a voltage of a second negative supply rail of a second storage cell subarray of the two or more storage cell subarrays.

2. The method of claim 1, wherein the second negative supply rail is coupled to a ground potential and the first negative supply rail is coupled to a voltage potential that is lower than the ground potential.

3. The method of claim 1, further comprising:
determining that the memory access request performs a write operation; and
applying, during the memory access, the voltage boost to a set of bitlines coupled to the first storage cell subarray by coupling the set of bitlines to the first negative supply rail.

4. The method of claim 3, wherein a voltage pump circuit configured to generate the boosted voltage couples the boosted voltage to the first negative supply rail of the first storage cell subarray and to the set of bitlines to apply the voltage boost.

5. The method of claim 1, further comprising enabling access transistors of one row of storage cells in the first storage cell subarray by coupling a positive voltage supply to the access transistors, wherein the positive voltage substantially equals a positive voltage supply that is provided to each storage cell in the storage cell array.

6. The method of claim 1, wherein the first negative supply rail is routed between storage cells in each row in the same direction as a wordline signal that enables access to the storage cells in the row is routed between the storage cells in the row.

7. The method of claim 6, wherein the first negative supply rail and the wordline signal are routed horizontally between storage cells in each row and a positive supply rail and bitlines are routed vertically between storage cells in a column that includes one storage cell in each row.

8. The method of claim 6, wherein a positive supply rail and bitlines are routed between storage cells in a direction opposing the direction of the wordline signal.

9. The method of claim 1, wherein an unused row of storage cells is coupled between the first storage cell subarray and an adjacent storage cell subarray of the two or more subarrays to decouple a first negative supply rail coupled to the first storage cell subarray from a second negative supply rail coupled to the adjacent storage cell subarray.

10. The method of claim 1, wherein voltage pump circuits are distributed within row decode circuitry for the storage cell array and a first set of signals input to the voltage pump circuits controls an amount of capacitance that is coupled to the negative supply rail during write operations.

11. The method of claim 10, wherein a second set of signals input to the voltage pump circuits controls the amount of capacitance that is coupled to the negative supply rail during read operations.

12. The method of claim 1, wherein the first storage cell subarray is enabled by a first boost enable circuit and the second storage cell subarray is enabled by a second boost enable circuit, and the first boost enable circuit and the second boost enable circuit are distributed within row decode circuitry for the storage cell array.

13. An integrated circuit comprising:
a memory array of storage cells comprising two or more storage cell subarrays, each storage cell subarray including at least one row of storage cells; and
an access assist circuit that is coupled to the memory array of storage cells and configured to:
receive a memory access request, wherein the memory access request specifies a read operation or a write operation and a voltage boost is applied during both read and write operations; and
apply, during the memory access, the voltage boost to a first negative supply rail of a first storage cell subarray of the two or more storage cell subarrays, wherein a boosted voltage of the first negative supply rail of the first storage cell subarray is lower than voltage of a second negative supply rail of a second storage cell subarray of the two or more storage cell subarrays.

14. The integrated circuit of claim 13, wherein the second negative supply rail is coupled to a ground potential and the first negative supply rail is coupled to a voltage potential that is lower than the ground potential.

15. The integrated circuit of claim 13, wherein the access assist circuit is further configured to:
determine that the memory access request performs a write operation; and
apply, during the memory access, the voltage boost to a set of bitlines coupled to the first storage cell subarray by coupling the first negative supply rail to the set of bitlines.

16. The integrated circuit of claim 13, wherein an unused row of storage cells is coupled between the first storage cell subarray and an adjacent storage cell subarray of the two or more subarrays to decouple the first negative supply rail coupled to the first storage cell subarray from the second negative supply rail coupled to the adjacent storage cell subarray.

17. The integrated circuit of claim 13, wherein the first negative supply rail is routed between storage cells in each row in the same direction as a wordline signal that enables access to the storage cells in the row is routed between the storage cells in the row.

18. The integrated circuit of claim 17, wherein a positive supply rail and bitlines are routed between storage cells in a direction opposing the direction of the wordline signal.

19. The integrated circuit of claim 13, wherein the access assist circuit comprises voltage pump circuits that are distributed within row decode circuitry for the memory array and a first set of signals input to the voltage pump circuits controls an amount of capacitance that is coupled to the negative supply rail during write operations.

20. The integrated circuit of claim 19, wherein a second set of signals input to the voltage pump circuits controls the amount of capacitance that is coupled to the negative supply rail during read operations.

* * * * *